(12) United States Patent
Ballon et al.

(10) Patent No.: US 10,830,844 B2
(45) Date of Patent: Nov. 10, 2020

(54) SYSTEMS AND METHODS FOR MR MICROSCOPY ANALYSIS OF RESECTED TISSUE

(71) Applicant: Cornell University, Ithaca, NY (US)

(72) Inventors: Douglas J. Ballon, Gillette, NJ (US); Brittany Dashevsky, New York, NY (US); Krishna Juluru, New York, NY (US); Eric Aronowitz, Ithaca, NY (US); Henning U. Voss, Ithaca, NY (US)

(73) Assignee: Cornell University, Ithaca, NY (US)

( * ) Notice: Subject to any disclaimer, the term of this patent is extended or adjusted under 35 U.S.C. 154(b) by 106 days.

(21) Appl. No.: 15/566,279

(22) PCT Filed: Apr. 18, 2016

(86) PCT No.: PCT/US2016/028169

§ 371 (c)(1),
(2) Date: Oct. 13, 2017

(87) PCT Pub. No.: WO2016/168850
PCT Pub. Date: Oct. 20, 2016

(65) Prior Publication Data

US 2018/0100903 A1    Apr. 12, 2018

Related U.S. Application Data

(60) Provisional application No. 62/149,148, filed on Apr. 17, 2015.

(51) Int. Cl.
*G01R 33/30* (2006.01)
*G01R 33/28* (2006.01)
(Continued)

(52) U.S. Cl.
CPC ............. *G01R 33/30* (2013.01); *G01N 24/08* (2013.01); *G01R 33/281* (2013.01);
(Continued)

(58) Field of Classification Search
None
See application file for complete search history.

(56) References Cited

U.S. PATENT DOCUMENTS

2008/0284430 A1* 11/2008 Tyszka ................. G01R 33/302
324/307
2015/0088449 A1*  3/2015 Foxall .................... A61B 6/583
702/104

OTHER PUBLICATIONS

Durand et al (High Resolution Magnetic Resonance Imaging of Prostatectomy Specimens: A Promising Tool for Virtual Histology, European Eurology, 62, 938-940, 2012; Cited on IDS dated Nov. 28, 2017.*

(Continued)

*Primary Examiner* — Jermele M Hollington
*Assistant Examiner* — Suresh K Rajaputra
(74) *Attorney, Agent, or Firm* — Foley & Lardner LLP

(57) ABSTRACT

The present disclosure discusses systems and methods for imaging tissue. The system can reduce the amount of vibrations that are transmitted from a magnetic resonance imaging device to a tissue sample. The system can include a stabilization platform with at least one vibration dampener coupled towards either end of the stabilization platform. A fluid reservoir is coupled to the stabilization platform and a resonator is coupled to the exterior of the fluid reservoir.

20 Claims, 5 Drawing Sheets

(51) Int. Cl.
*G01R 33/465* (2006.01)
*G01R 33/56* (2006.01)
*G01N 24/08* (2006.01)
G01N 1/31 (2006.01)
G01R 33/483 (2006.01)
G01R 33/341 (2006.01)

(52) U.S. Cl.
CPC ....... *G01R 33/465* (2013.01); *G01R 33/5604* (2013.01); *G01N 1/312* (2013.01); *G01R 33/341* (2013.01); *G01R 33/4838* (2013.01)

(56) References Cited

OTHER PUBLICATIONS

Ma et al (In vivo 3D digital atlas database of the adult C57BU6J mouse brain by magnetic resonance microscopy, Frontiers in Neuroanatomy, vol. 2, Article 1, pp. 1-10, Apr. 2008; Cited on IDS dated Nov. 28, 2017.*

Bath, Kevin et al., "Quantitative intact specimen magnetic resonance microscopy at 3.0 T", Magnetic Resonance Imaging 27, 2009, pp. 672-680.

Dashevsky et al., "The Potential of High Resolution Magnetic Resonance Microscopy in the Pathologic Analysis of Resected Breast and Lymph Tissue", Dec. 7, 2015, pp. 1-8.

Durand et al., "High-Resolution Magnetic Resonance Imaging of Prostatectomy Specimens: A Promising Tool for Virtual Histology", European Association of Urology, Aug. 10, 2012, pp. 938-940.

International Preliminary Report on Patentability issued on PCT/US2016/028169, dated Oct. 17, 2017.

International Search Report and Written Opinion of the International Searching Authority on International Application No. PCT/US2016/028169 dated Jul. 26, 2016.

Ma et al., "In vivo 3D digital atlas database of the adult c57BL/6J mouse brain by magnetic resonance microscopy", Frontiers in Neuroanatomy, Apr. 2008, vol. 2, Article 1, pp. 1-10.

* cited by examiner

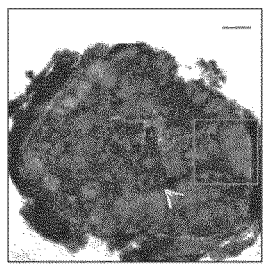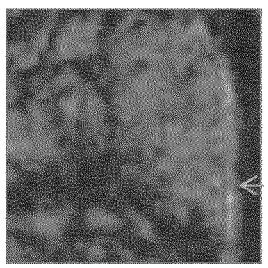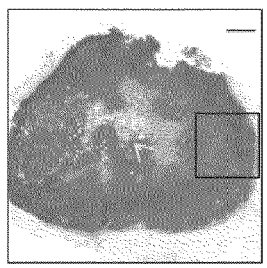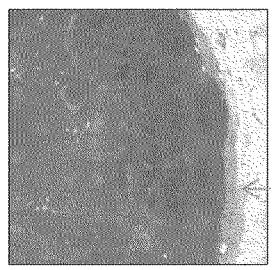
*Figure 8A*  *Figure 8B*
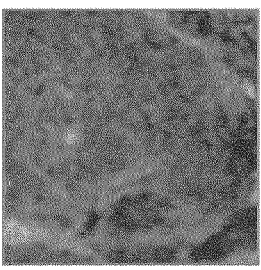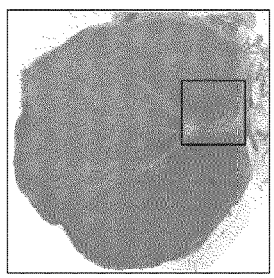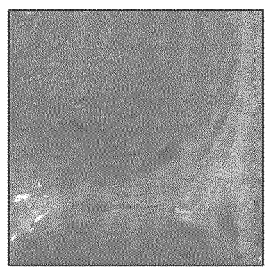
*Figure 9A*  *Figure 9B*

Figure 10A

| Disease | MR Diagnosis % Correct | LM Diagnosis % Correct | P-value | MR Disease % Correct | LM Disease % Correct | P-value | MR Tissue % Correct | LM Tissue % Correct | P-value |
|---|---|---|---|---|---|---|---|---|---|
| Benign Lymph Node | 36% | 93% | 0.002 | 64% | 93% | 0.062 | 50% | 93% | 0.003 |
| Ductal Carcinoma in Situ (DCIS) | 64% | 100% | 0.013 | 86% | 100% | 0.147 | 100% | 100% | 1.00 |
| Fibroadenoma (N=2) | 57% | 100% | <0.001 | 64% | 100% | 0.001 | 68% | 100% | 0.001 |
| Invasive Ductal Carcinoma and DCIS | 14% | 79% | 0.001 | 86% | 100% | 0.147 | 93% | 100% | 0.314 |
| Invasive Lobular Carcinoma | 21% | 71% | 0.008 | 86% | 100% | 0.147 | 100% | 100% | 1.00 |
| Malignant Lymph Node | 36% | 93% | 0.002 | 43% | 100% | 0.001 | 93% | 93% | 1.00 |
| Normal Breast Parenchyma (N=3) | 24% | 95% | <.0001 | 24% | 100% | <.0001 | 98% | 100% | 0.357 |
| Overall | 36% | 92% | 0.009 | 57% | 99% | 0.021 | 87% | 99% | 0.303 |

Pathologic Diagnosis (Gold Standard)

| Diagnosis based on 7T MR Images | ILC*‡ | IDC and DCIS*‡ | DCIS*‡ | Malignant LN‡ | Benign LN* | Fibroadenoma | Normal Breast Parenchyma‡ |
|---|---|---|---|---|---|---|---|
| ILC | 21% | | | | | 4% | 17% |
| IDC | 36% | 7% | 7% | | 7% | | 43% |
| IDC and DCIS | 21% | 14% | 14% | 7% | 14% | | 2% |
| DCIS | 7% | 57% | 64% | 36% | 14% | 4% | 12% |
| Malignant LN | | 7% | | 57% | 36% | 29% | 2% |
| Benign LN | | | | | 29% | 4% | |
| Fibroadenoma | | | | | | 57% | |
| Normal Breast Parenchyma | 14% | 14% | 14% | | | 4% | 24% |

When comparing the diagnosis utilizing 7T MRI vs light microscopy:
\* p>0.05 for benign vs. malignant
‡ p>0.05 for breast vs. lymph tissue

*Figure 10B*

SYSTEMS AND METHODS FOR MR MICROSCOPY ANALYSIS OF RESECTED TISSUE

CROSS REFERENCE TO RELATED APPLICATIONS

This application is a U.S. National Phase application under 35 U.S.C. 371 of international application Serial No. PCT/US2016/028169, filed on Apr. 18, 2016 which in turn claims priority to and the benefit of U.S. provisional patent application Ser. No. 62/149,148, filed Apr. 17, 2015. The entire contents of the foregoing references are incorporated herein by reference.

FIELD

The present disclosure is directed to systems and methods for histological analysis.

BACKGROUND

Clinical MRI is a sensitive (94%) screening test available for detecting breast cancer, but lacks specificity (26%). To obtain a definitive diagnosis, patients undergo percutaneous biopsy and/or surgical resection of suspicious lesions. In preparation for pathologic analysis, a pathologist subjectively selects an area of the specimen and removes a few slices of tissue, which are then analyzed following a staining process that takes at least 12 hours. The subjective selection of slice introduces the possibility of sampling error. The prolonged time needed for pathological analysis limits the value to the surgeon. Should the pathologist determine that a surgical margin of the tissue contains cancerous cells, the patient must undergo a second operative procedure, to obtain margins free of tumor and improve patient outcome.

SUMMARY

Disclosed herein are systems and methods for magnetic resonance imaging of resected tissue. The method includes applying a contrast agent to a tissue sample. The method also includes placing the tissue sample in a cassette configured to hold the tissue sample with the contrast agent. The cassette is stabilized by an insert configured to hold the cassette and a radiofrequency resonator and brace the cassette within the bore of a magnetic resonance imaging system. One or more high resolution images of the tissue sample are acquired by the magnetic resonance imaging system.

According to one aspect of the disclosure, a system for magnetic resonance imaging of resected tissue includes a stabilization platform. The system also includes at least one vibration dampener coupled towards each end of the stabilization platform. The vibration dampeners are configured to stabilize the stabilization platform within a bore of a magnetic resonance imaging machine. The system also includes a fluid reservoir that is configured to receive a cassette. The fluid reservoir is coupled to the stabilization platform. The system also includes a plurality of coils forming a resonator. The resonator is coupled to an exterior surface of the fluid reservoir and enables the magnetic resonance imaging machine to acquire images of a tissue sample in the cassette.

In some implementations, the system also includes a plurality of vibration dampeners that are distributed along the length of the stabilization platform. The resonator can be tunable. The resonator can be a solenoidal resonator. In some implementations, the plurality of coils include three parallel wound coils.

In some implementations, the at least one vibration dampeners include polyethylene foam. A diameter of the at least one vibration dampener can be substantially equal to a diameter of the bore of the magnetic resonance imaging machine. In some implementations, the cassette is a pathology cassette. The fluid reservoir is configured to contain a contrast agent. The contrast agent can include a 1% solution of gadolinium diethylene triamine pentaacetic acid (Gd-DTPA).

According to another aspect of the disclosure, a method of imaging tissue can include providing a stabilization system. The system can include a stabilization platform and at least one vibration dampeners coupled towards each end of the stabilization platform. The vibration dampeners are configured to stabilize the stabilization platform within a bore of a magnetic resonance imaging machine. The system also includes a fluid reservoir that is configured to receive a cassette coupled to the stabilization platform. The system also includes a plurality of coils forming a resonator. The resonator is coupled to an exterior surface of the fluid reservoir to enable the magnetic resonance imaging machine to acquire images of a tissue sample in the cassette. The method also includes adding a contrast agent to the fluid reservoir and inserting the cassette, which holds a resected tissue sample, into the fluid reservoir. The method also includes acquiring one or more magnetic resonance microscopy images of the resected tissue sample.

In some implementations, the contrast agent can include a solution of Gd-DTPA. The contrast agent can include between about 1% and about 10% Gd-DTPA. In some implementations, the stabilization system can include a plurality of vibration dampeners distributed along the length of the stabilization platform.

In some implementations, the the resonator is tunable. The resonator can be a solenoidal resonator. The plurality of coils can include three parallel wound coils. The at least one vibration dampener can include a polyethylene foam. A diameter of the at least one vibration dampener can be substantially equal to a diameter of the bore of the magnetic resonance imaging machine. The cassette can be a pathology cassette.

The foregoing general description and following description of the drawings and detailed description are exemplary and explanatory and are intended to provide further explanation of the invention as claimed. Other objects, advantages, and novel features will be readily apparent to those skilled in the art from the following brief description of the drawings and detailed description of the invention.

BRIEF DESCRIPTION OF THE DRAWINGS

The skilled artisan will understand that the figures, described herein, are for illustration purposes only. It is to be understood that in some instances various aspects of the described implementations may be shown exaggerated or enlarged to facilitate an understanding of the described implementations. In the drawings, like reference characters generally refer to like features, functionally similar and/or structurally similar elements throughout the various drawings. The drawings are not necessarily to scale; emphasis instead being placed upon illustrating the principles of the teachings. The drawings are not intended to limit the scope of the present teachings in any way. The system and method may be better understood from the following illustrative description with reference to the following drawings in which:

FIGS. 8A-9B are images comparing magnetic resonance microscopy acquired images to images acquired with conventional histology.

FIGS. 10A and 10B illustrate tables of the results of a comparison between images acquired with magnetic resonance microscopy and light microscopy.

DETAILED DESCRIPTION

Standard diagnostic magnetic resonance imaging (MRI) is sensitive but may not be specific in the detection of breast cancer. Pathological analysis of core biopsy and lumpectomy specimens can have sampling error and prolonged times needed for sample preparation prior to analysis. Disclosed herein is an magnetic resonance (MR) technique for imaging lumpectomy specimens with sufficient spatial resolution and speed to offer value in intra-operative decision making. The subject matter of the present disclosure provides the ability to image breast and lymphatic tissue using MRI, achieving a spatial resolution of 60×60×90 µm$^3$ with a signal-to-noise ratio of between about 15 and about 20, with an imaging time of 56 to 70 minutes. Images revealed characteristic features of both benign and malignant tissue, some of which were discernable by pathologists who had no prior training in high resolution MRI interpretation.

The subject matter of the present application facilitates MR microscopy of resected breast, lymph tissue, and other tissue, and can demonstrate the possibility of pathological diagnosis from these images. The speed of the technique offers the possibility to guide intra-operative decision-making. The high spatial resolution enables the technique to be used as a tool for pathologists to navigate larger resected specimens in the selection of ideal samples for more detailed analysis.

Clinical MRI is a sensitive (94%) screening test available for detecting breast cancer, but can lack specificity (26%). To obtain a definitive diagnosis, patients undergo percutaneous biopsy and/or surgical resection of suspicious lesions. In preparation for pathologic analysis, a pathologist subjectively selects an area of the specimen and removes a few slices of tissue, which are then analyzed following a staining process that takes at least 12 hours. The subjective selection of slice introduces the possibility of sampling error. The prolonged time needed for pathological analysis limits the value to the surgeon. Should the pathologist determine that a surgical margin of the tissue contains cancerous cells, the patient may undergo a second operative procedure, to obtain margins free of tumor and improve patient outcome. The present disclosure describes tools that can guide pathologists to areas of high diagnostic yield within a tissue specimen, and tools that can expedite the pathologic interpretation process.

MR microscopy (MRM) can refer to MRI techniques that achieve sub 100 µm resolution. The resolution can exceed that of standard MRI (1 cm), enabling the visualization of histologic detail.

Figure 1:
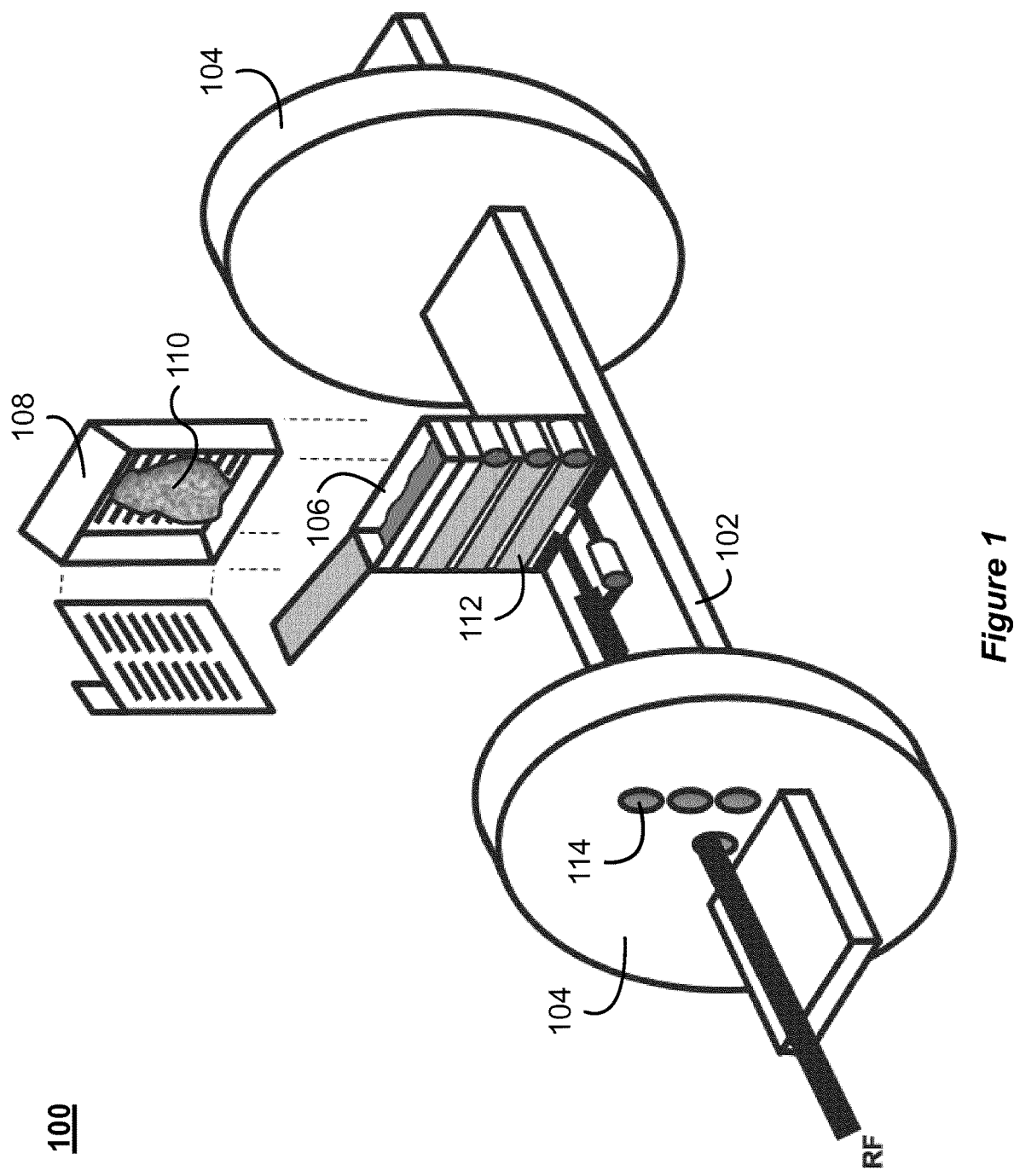
FIG. 1 is a schematic diagram illustrating an example system for MR microscopy analysis of resected tissue.

FIG. 1 illustrates a stabilization system 100 for MRM analysis of a resected tissue sample. The system includes a stabilization platform 102. Two vibration dampeners 104 are coupled to towards either end of the stabilization platform 102. A fluid reservoir 106 is coupled to the stabilization platform 102. The fluid reservoir 106 is configured to receive a cassette 108, which contains a tissue sample 110. A plurality of resonator coils 112 are wound around the fluid reservoir 106. The system 100 is configured to fit into the bore of an MRI machine, and stabilize the tissue sample 110 during imagining.

The MRI machine can be one of any MRI machine suitable for imaging biological tissue. For example, the MRI machine can be a 7 to 11 Telsa (T) small-bore MRI machine. In some embodiments, the MRI machine may not be a small-bore MRI machine.

The system 100 includes a stabilization platform 102. The stabilization platform 102 can include a rigid, non-magnetic material such as a plastic or wood. The length of the stabilization platform 102 is between about 15 inches and about 24 inches. Vibration dampeners 104 are coupled towards the ends of the stabilization platform 102. As illustrated, the system 100 includes two vibration dampeners 104. In other implementations, the system 100 can include a single vibration dampener 104 or more than two vibration dampeners 104 that are distributed along the length of the stabilization platform 102. Each of the vibration dampeners 104 have a diameter substantially equal to, or slightly larger than the MRI machine's bore diameter. For example, the diameter of the vibration dampeners 104 can be between about 12 cm and about 40 cm. In some implementations, the gradient switching of the MRI machine can cause vibrations of a sample placed within the machine's bore. The vibrations can reduce the sharpness of the images captured with the MRI machine. The vibration dampeners 104 are configured to reduce the amount of vibration from the MRI machine that is imparted onto the tissue sample 110. Reducing the vibrations imparted to the tissue sample 110 can increase the sharpness of the captured images. The vibration dampeners 104 can include a vibration absorbing material such as a rubber or foam. In some implementations, the vibration absorbing material can be polyethylene foam. In some implementations, the vibration dampener 104 can be other shapes, such as arms or braces that suspend the stabilization platform 102 from the bore of the MRI machine and reduce vibrations transmitted to the tissue sample 110.

The system 100 can also include a cassette 108. The cassette 108 can be disposable, and can be replaced after each new tissue sample 110. In some embodiments, the tissue sample 110 is a tumor sample resected from tissue. For example, the tumor sample can be resected from a breast during a lumpectomy procedure. The tissue sample 110 can be imaged using the system 100 to determine whether the margins of the tissue sample 110 are clean from tumor tissue. The tissue sample may also be a resected sample from other parts of a body. The cassette 108 can be manufactured from a dense polymer, such as a high density acetal polymer or other material that is resistant to histological solvents. The walls of the cassette 108 include a number of openings. For example, one or more walls can include holes or slits. The openings enable fluids from the fluid reservoir 106 to flow into around the tissue sample 110. In some implementations, the cassette 108 is between about 5 mm and about 15 mm thick, between about 20 and about 40 mm tall, and between about 20 and about 40 mm wide.

The system 100 can also include a fluid reservoir 106. The fluid reservoir 106 is configured to receive the cassette 108.

The fluid reservoir 106 can be sized such that the cassette 108 it receives cannot move or vibrate once placed in the fluid reservoir 106. The system 100 can include shims that deployed between the cassette 108 and the interior walls of the fluid reservoir 106 to ensure the cassette 108 remains in place. During imaging sessions, the fluid reservoir 106 can be filled with a fluid that permeates into the tissue sample 110 via the openings in the cassette 108. The fluid can be a contrast agent. In some implementations, the contrast agent is a 1% solution of gadolinium diethylene triamine pentaacetic acid (Gd-DTPA). The contrast agent can be in other concentrations, such as between about 1% and 15%, between about 1% and about 10%, or between about 1% and about 5%. In other embodiments, the contrast agent can include other T1 or T2 MRI contrast agents besides Gd-DTPA.

The coils 112 form a radio frequency resonator and are wrapped around the fluid reservoir 106. The radio frequency resonator can be a transmit/receive resonator or can include separate transmit and receive resonators. In some embodiments, the coils 112 can be wrapped around the cassette 108. As illustrated the radio frequency resonator includes three coils 112. The radio frequency resonator can include more than 3 coils 112 or less than 3 coils 112. Each of the coils 112 can include a plurality of windings of a copper wire. In other implementations, each of the coils 112 include windings of a copper foil. In some implementations, the coils 112 form a solenoidal resonator. The resonator can be tunable to match the resonate frequency of the MRI machine. For example, the vibration dampener 104 can include a number of pass through holes 114 that allow the shaft of a screw driver to be passed through the vibration dampener 104. The screw driver can can be used to tune the resonator by adjusting the capacitance between the coils 112.

Figure 2:
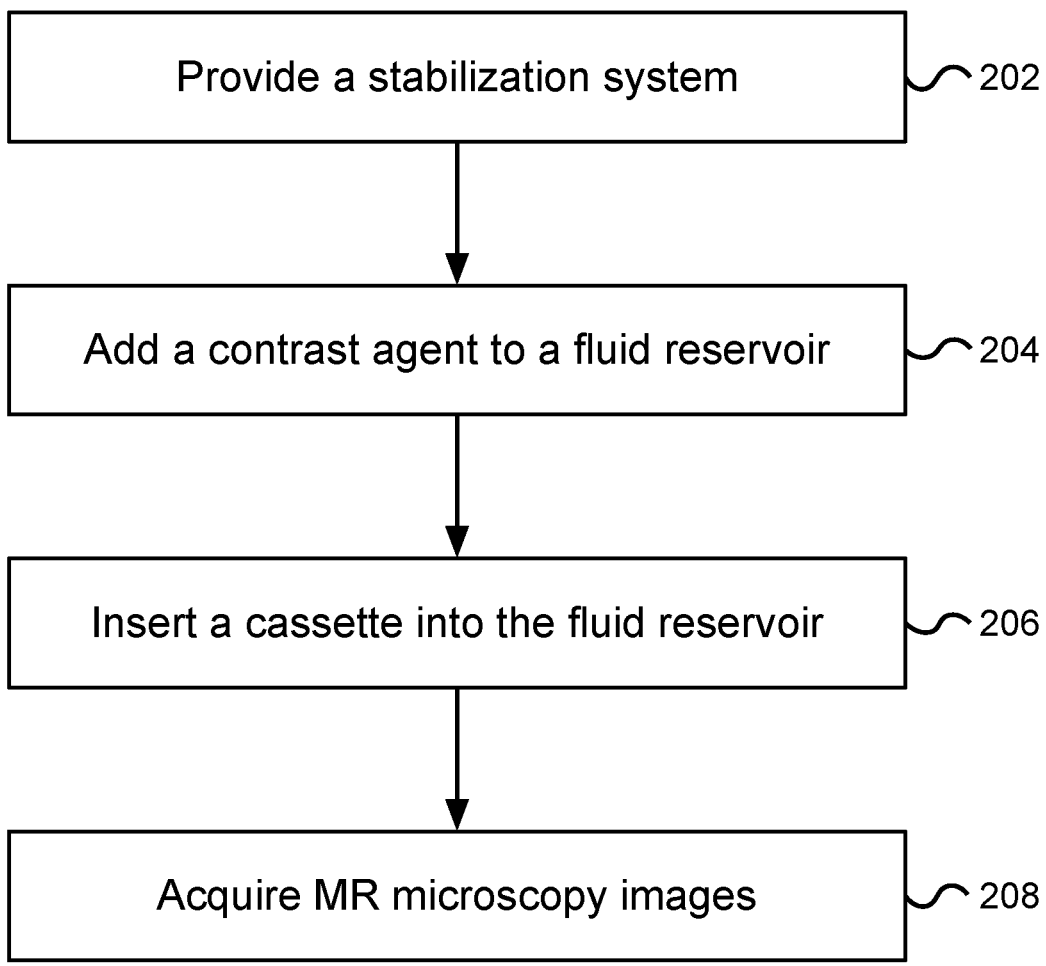
FIG. 2 is a block diagram of a flow chart for imaging a tissue sample.

FIG. 2 illustrate a block diagram of an example method 200 for imaging tissue. The method 200 includes providing a stabilization system (step 202). The method also includes adding a contrast agent to a fluid reservoir of the stabilization system (step 204). The method also includes inserting a cassette into the fluid reservoir (step 206), and acquiring magnetic resonance (MR) microscopy images (step 208).

As set forth above, the method 200 includes providing a stabilization system. Also referring to FIG. 1, the stabilization system can be similar to the stabilization system 100 described above. The stabilization system can include a stabilizing platform. The stabilizing platform can include vibration dampeners coupled towards the ends of the stabilization platform. That vibration dampeners can reduce the amount of vibration that is transmitted from the MRI machine to a tissue sample that is later placed in the stabilization system 100. The system 100 also includes a fluid reservoir and a resonator that is coupled around the exterior of the fluid reservoir.

The method 200 also includes adding a contrast agent to the fluid reservoir (step 204). During imaging sessions, the contrast agent in the fluid reservoir can permeate into the tissue sample. In some implementations, the contrast agent is a 1% solution of gadolinium diethylene triamine pentaacetic acid (Gd-DTPA). The contrast agent can be in other concentrations, such as between about 1% and 15%, between about 1% and about 10%, or between about 1% and about 5%. In other embodiments, the contrast agent can include other T1 or T2 MRI contrast agents besides Gd-DTPA.

The method 200 also includes inserting a cassette into the fluid reservoir (step 206). The cassette can be a pathology cassette and can include the tissue sample that is to be imaged. The cassette can include a plurality of opening that enable the contrast agent to permeate into the tissue sample. In some implementations, shims can be added sides of the cassette to secure the cassette in the fluid reservoir.

The method 200 also includes acquiring MR microscopy images of the tissue samples (step 208). Once the cassette is secured into the fluid reservoir, the stabilization system can be inserted into the bore of a MRI machine. Once in the MRI machine, the resonator around the fluid reservoir can be tuned to match the resonate frequency of the MRI machine. MR microscopy images can be captured using echo T1 acquisition parameters.

EXAMPLE

A Study of MR Histopathology of Breast and Lymph Tissue

In one example, the system described herein was used with a MRI machine with a 7 T small-bore magnet configured to imaging fresh breast and lymph node tissue obtained from lumpectomy and/or axillary lymph node dissection. The MRI machine achieved an imaging spatial resolution of 60×60×90 μm$^3$. The system described herein can also be used with other MRI systems. In this example, a total of 10 specimens were imaged. Average imaging time per specimen was just over one hour. Pathologies of the tissues, as determined by subsequent standard light microscopy assessment, included normal breast parenchyma (n=3), fibroadenoma (n=2), ductal carcinoma in situ (DCIS) (n=1), invasive ductal carcinoma (IDC) and DCIS (n=1), invasive lobular carcinoma (ILC) (n=1), in addition to benign axillary lymph node (n=1) and axillary lymph node containing metastatic carcinoma (n=1).

A. MRM of Breast Tissue

Figure 3A:
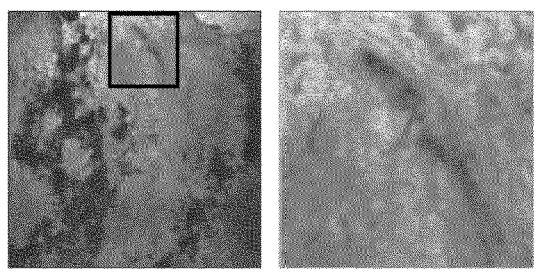
FIGS. 3A-7B are images comparing magnetic resonance microscopy acquired images to images acquired with conventional histology.
Figure 3B:
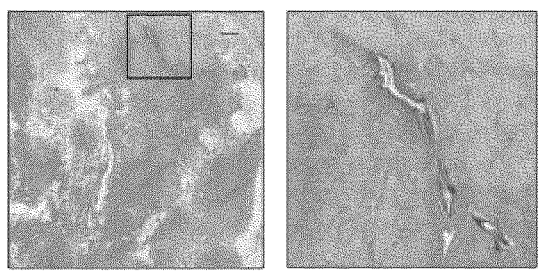

Normal breast tissue was obtained from patients undergoing elective reduction mammoplasty. This was chosen to confirm the technique was successful in obtaining adequate resolution of identifiable normal structures, as confirmed by a breast pathologist. FIG. 3A illustrates a normal breast parenchyma, which can appear as fibroglandular tissue with interspersed globular hypointense fat. A cross-section of a benign duct is magnified in the adjacent box. FIG. 3B illustrates substantially the same portion of tissue using stained light microscopy image. A microscopic examination of the images illustrated in FIG. 3B confirmed benign inactive breast glandular tissue in predominantly fibrous stroma.

The illustrated in FIG. 3B appears as a well-circumscribed ovoid nodular lesion, here measuring up to 2.5 cm in maximum diameter. Internally, the fibroadenoma is comprised of a cleft-like network of hypointense tissue. On histology, the fibroadenoma is a circumscribed tumor with stromal and glandular components. The tumor shows an intracanalicular pattern, characterized by compression of glands by the stroma, forming slit-like spaces.

Figure 4A:
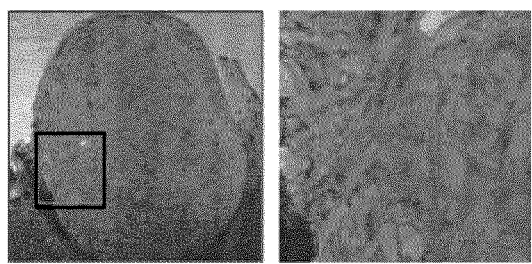
Figure 4B:
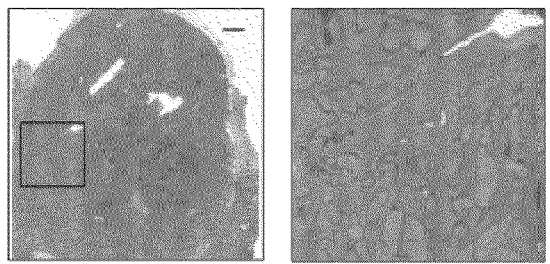
Figure 5A:
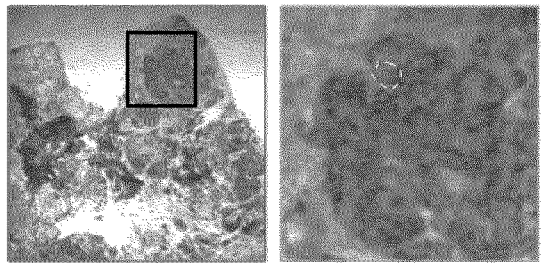
Figure 5B:
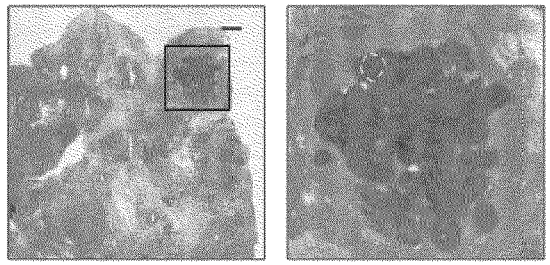
Figure 6A:
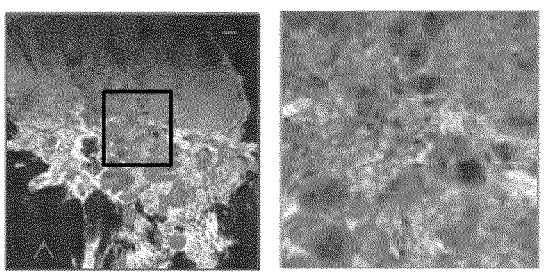
Figure 6B:
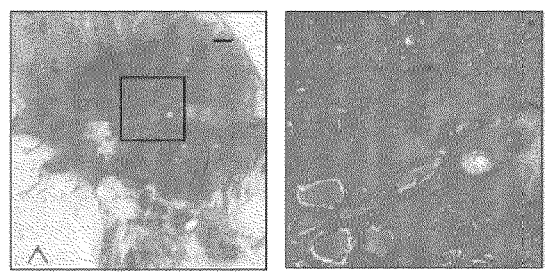
Figure 7A:
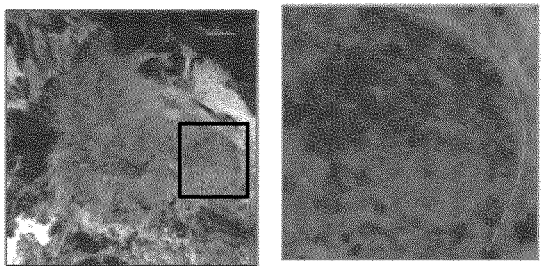
Figure 7B:
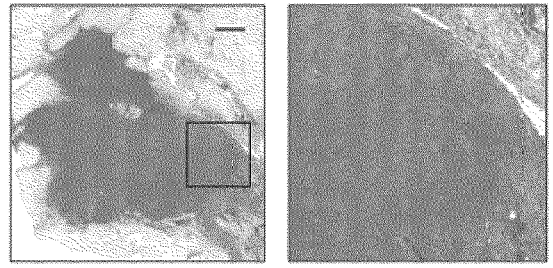

Using the same techniques, malignant pathology was also evaluated. FIGS. 4A-7B illustrate the malignant pathology of specimens from patients that had biopsy proven to include carcinoma. FIGS. 4A and 4B illustrate a tissue sample including a fibroadenoma; FIGS. 5A and 5B illustrate DCIS; FIGS. 6A and 6B illustrate IDC and DCIS; and FIGS. 7A and 7B illustrate ILC. In each of the FIGS. 3A-7B, the "A" figures illustrate the image captured using the system described herein and the "B" figures illustrate the image captured with stained light microscopy image. An expanded view of the area within the each of the boxes is demonstrated on the right, at 4× the magnification. The scale bar at top right is 1.25 mm. In FIG. 5A, DCIS appears as a cluster of expanded ducts containing hypointense material that is consistent with necrosis. Histology is also characterized by expanded ducts and lobules containing a solid proliferation of monotonous neoplastic cells of intermediate nuclear grade. Luminal necrosis is evident in some ducts.

In FIG. 6A, the specimen which contained both IDC and DCIS and include an area of centrally expanded ducts which was both visually similar to the MRM DCIS specimen and corresponded microscopically to areas of micropapillary and cribriform DCIS with luminal necrosis (box). These ducts were present within an enhancing irregular mass, which corresponded to IDC on microscopic examination. MRM images demonstrate wisp-like linear hyperintense striations extending peripherally from the tumor margin. On histology, these findings corresponded to a 1.6 cm well-differentiated IDC characterized by tubules growing haphazardly within a desmoplastic stroma and infiltrating the adjacent tissue.

In FIG. 7A, the ILC appears as an enhancing, irregular mass absent of gland formation in the background of normal parenchyma. On histology, ILC was characterized by tumor cells growing in single file arrangement and as solid nests into adjacent breast and adipose tissue. Cells were of intermediate nuclear grade. An E-cadherin immunostain demonstrated absent membranous reactivity in tumor cells, confirming a diagnosis of ILC.

B. MRM of Lymph Nodes

FIGS. 8A-9B illustrate benign and malignant axillary lymph nodes. FIGS. 8A and 9A illustrate images captured using an MRI machine and using the system described herein. FIGS. 8B and 9B illustrate images captured using stained light microscopy image. FIGS. 8A and 8B illustrate a normal imaged lymph node and contains rounded, hyperintense areas around its periphery with a hypointense, darker center, corresponding on histology to lymphoid follicles surrounding a central mixed-attenuation fatty/fibrous hilum. This lymph node measures 1 cm in maximum diameter and is bounded by a 120 μm thick smooth capsule. This capsule is undisrupted in its imaged course. This lymph node was negative for metastatic carcinoma on H&E examination using stained light microscopy. A negative cytokeratin (AE1/AE3) immunostain excluded the presence of micrometastatic deposits and isolated tumor cells.

In contrast, FIGS. 9A and 9B illustrate a lymph node containing metastatic carcinoma, which exhibits replacement of the normal lymphoid architecture with a disorganized matrix. Small segments of normal capsule are visualized, with the remaining capsule disrupted by tumor invasion. On histology this lymph node was virtually replaced by metastatic poorly-differentiated ductal carcinoma. Extracapsular extension was not present.

C. Comparison of Diagnostic Performance of MMR to Light Microscopy

FIGS. 10A and 10B illustrate the results of this example. Utilizing MR microscopy, fourteen pathologists selected the correct diagnosis (exact diagnosis) for 36% of cases, the correct disease process (benign vs. malignant) for 57% of cases, and the correct tissue type (breast vs. lymph node) for 87% of cases, compared to 92%, 99% and 99% respectively, utilizing light microscopy images of H&E stained specimens (FIG. 10A). The results were significantly different for 7 T MR versus light microscopy in determining the correct diagnosis (p=0.01) and disease process (p=0.02). There was no significant difference between the two modalities in selecting tissue type (p=0.30). However, pathologists correctly selected a malignant versus benign disease, with no significant difference between MR and light microscopy for the following specimens: benign lymph node, DCIS, IDC and DCIS, and ILC. FIG. 10B illustrates pathologists' individual responses to the MR images for each pathologic diagnosis.

D. Discussion of the Exemplary Study

The example study illustrates the successful development of the systems and methods described herein to to prepare tissue and image the tissue with an MRI system. The system and method are used to obtain ex-vivo images of breast and lymph tissue with a spatial resolution that is orders of magnitude better than conventional breast MR imaging, and similar that of light microscopy. This process is generally referred to as Magnetic Resonance Microscopy (MRM). Slice-matched MRM and light microscopy images demonstrated numerous structural similarities between benign and malignant tissue specimens. Glandular tissue, ducts, tubules, lymph follicles, and tissue margins were all apparent when MRM images were viewed alongside their slice-matched light microscopy counterparts. Whereas the light microscopy images took over 12 hours to prepare, MRM images may be obtained in approximately 1 hour.

The structural similarities with light microscopy, in combination with a reduction in the time to obtain images, introduces a unique role for MRI in the management of breast cancer. The MRM technology disclosed herein has the potential to guide intra-operative decision making as well as serve as a tool for pathologic navigation.

The system described herein can reduce the likelihood that a patient will need additional surgery to resect additional tissue. Traditional pathologic assessment of surgical specimens is limited by processing time (e.g., 12 hr.) and sampling bias. The presence of tumor at the surgical margin of a resected specimen is a predictor for local recurrence, thus the American Society of Clinical Oncology (ASCO) recommends that surgically inked margins from breast conservation surgery be negative for malignancy. Pathologic margin status can only be determined post-operatively when using light microscopy because of a long histopathologic evaluation time. When using light microscopy, a diagnosis of positive tumor margins in the resected sample can require another surgery for re-excision. Currently, about 25% of women treated with breast conservation therapy undergo re-excision to obtain negative surgical margins. A more expedited determination of surgical margins using the systems and methods described herein could guide the intra-operative decision to remove extra tissue at the time of initial surgery. This could reduce the necessity for a second procedure, reducing patient discomfort and anxiety, reducing medical costs, and potentially reducing surgical morbidity and mortality.

The tissue slice selected for pathologic tumor grading is based on the best judgment of the interpreting pathologist. The pathologist palpates the entire resected specimen, identifies an area that is felt to represent a mass, and performs a slice through that area for microscopic analysis. The specimen is then further assessed by slicing at regular intervals. There is the potential, therefore, that areas of tumor may be entirely missed, including areas with different grade of disease. With MRM, images can first be obtained through an entire resected specimen without physically slicing the tissue. This may serve as a useful navigation tool to guide a pathologist to areas of interest within a resected specimen. Slices cut through these areas of interest could help increase the diagnostic yield of resected tissue, reducing the rates of sampling bias, and potentially affecting treatment.

To test the diagnostic accuracy of MRM in evaluation of breast and lymph tissue, images were blindly presented to pathologists with no prior experience in MRM interpretation. Despite this lack of training, the pathologists did better than expected in several areas. FIGS. 10A and 10B provide the results when the MRM images of DCIS were presented to pathologists. The pathologists made the correct diagnosis in 64% of cases, and properly identified the tissue as malignant in 86% of cases. When presented with MRM images of ILC, pathologists made the correct diagnosis in only 21% of cases, but properly identified the tissue as malignant in 86% of cases. If MRM is to be used for intra-operative decision making or as a tool for pathologic navigation, then differentiation of benign from malignant tissue is the primary objective, allowing for an exact diagnosis to be made at a later time with light microscopy.

The system and methods described herein are able to visualize distinctive features of both benign and malignant lesions approximately 1 hour after tissue resection, making possible some important clinical use-cases.

In some implementations, MR microscopy can be employed to achieve high resolution images of resected breast and lymph tissue that can be used to differentiate benign from malignant pathology. Diagnostic quality images can be obtained of an entire specimen in just over an hour. This technique offers the possibility of providing valuable information to surgeons in the intra-operative setting, and can serve as a navigation tool to help pathologists localize areas of concern within resected tissue, thereby reducing sampling error. The present technology can be used in analysis of a variety of tissue other than breast.

E. Specimen Preparation and Handling

Resected tissue was transported from the operating room to the institutional pathology laboratory per routine procedure. Fresh specimens were sliced in 3-4 mm sections and a single slice was placed into a standard pathology cassette with inside dimensions of 30×27×5 mm. The specimen containing cassette was hand delivered to our Imaging Center within 30 minutes of removal from the body. The cassette containing specimen was immersed in 1% gadolinium-diethylenetriaminepentaacetic acid (Gd-DTPA) immediately prior to imaging and soaked in Gd-DTPA for the duration of imaging. After imaging, the specimen was transported to the Pathology Department for histological evaluation.

F. MRM at 7.0 Tesla

To improve specimen resolution, as described above, a three turn parallel wound solenoidal transmit/receive resonator was coupled to the outside of the fluid reservoir 106.

Images were acquired on a Bruker Biospec 30 cm bore 7 Tesla magnetic resonance imaging system equipped with B-GA 12S gradient coils rated at 450 mT/m. Other suitable MRI systems may be used. The tissue samples were placed in the system 100 described above.

Gradient echo T1 acquisition parameters were applied with a field-of-view=60×60×12 mm, effective echo time=13.1 ms, sequence repetition time=26.3 s, matrix size=512×512, slice thickness=94 µm. A total of 2 or 3 sequential 57 minute acquisitions were acquired for each specimen. For specimens with high fat content, fat suppressed gradient echo T1 weighted sequences were obtained (scan time: 70 minutes). Specimens with high fat content demonstrated chemical shift artifact in the absence of fat saturation. Thus, fat saturation sequences were performed on all specimens, except lymph node and fibroadenoma specimens. Other suitable pulse sequences and image acquisition parameters may be used.

A total of 10 specimens were imaged. Pathologies of tissues were subsequently determined by standard light microscopy assessment, and included normal breast parenchyma (n=3), fibroadenoma (n=2), DCIS (n=1), IDC and DCIS (n=1), ILC (n=1), in addition to benign axillary lymph node (n=1) and axillary lymph node containing metastatic carcinoma (n=1).

The cassette system developed and optimized for sectioned specimens fixed each sample in position, thereby limiting motion or vibration due to rapidly switching gradients, helping attain the high-resolution images. Also, since the cassette aligned the specimen spatially for MRI, subsequent slicing of the specimen from the cassette rendered it straightforward to register the MR and pathology images.

G. Histologic Preparation and Examination

Following completion of MRI, the specimens were returned to the pathology department, whereby they were fixed in formalin and processed routinely. 5 µm thick hematoxylin and eosin (H&E) stained sections were prepared from paraffin blocks and scanned on an Aperio Scan Scope AT and viewed on Aperio Image Scope (Leica Biosystems, Buffalo Grove, Ill., USA). MR and light microscopy images were compared.

H. MR/Pathology Survey

An online in-house reader study was prepared, whereby 14 pathologists (10 attendings, 3 residents and 1 fellow) at New York Presbyterian hospital assessed the diagnostic potential of MRM. The untrained blinded readers were asked to select the correct diagnosis for 10 specimens imaged utilizing 7T MRI, followed by the slice matched light microscopy images, arranged in random order. No pathologist had any prior experience with MRI or MRM.

I. Statistical Analysis

To analyze survey responses for MR and pathology, the proportion of correctly identified images for specific disease, as well as, disease (benign or malignant) and tissue (breast or lymph node) type were calculated. Furthermore, the overall average percent correctly identified for each specific diagnosis, as well as disease and tissue type were calculated. Differences between MR and pathology images for each survey question and the overall percent correctly identified were calculated using a two-sample proportion test. All p-values less than 0.05 are considered statistically significant. All analyses were performed using SAS v9.3 (SAS Institute, Cary, N.C.).

Definitions

As used herein, the term "about" and "substantially" will be understood by persons of ordinary skill in the art and will vary to some extent depending upon the context in which it is used. If there are uses of the term which are not clear to persons of ordinary skill in the art given the context in which it is used, "about" will mean up to plus or minus 10% of the particular term.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one" in reference to a list of one or more elements should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03

It will be apparent to those skilled in the art that various modifications and variations can be made in the methods of the present invention without departing from the spirit or scope of the invention. Thus, it is intended that the present invention cover the modifications and variations of this invention provided they come within the scope of the appended claims and their equivalents. All publicly available documents referenced herein, including but not limited to U.S. patents, are specifically incorporated by reference.

What is claimed:

1. A system for magnetic resonance imaging of resected tissue comprising:
    a stabilization platform;
    at least one vibration dampener coupled towards each end of the stabilization platform and configured to stabilize the stabilization platform within a bore of a magnetic resonance imaging machine;
    a fluid reservoir coupled to the stabilization platform and configured to contain a fluid and to receive a cassette, the cassette including one or more openings to receive the fluid from within the fluid reservoir;
    one or more shims coupled with sides of the cassette to restrict movement of the cassette within the fluid reservoir during an imaging session; and
    a plurality of coils forming a resonator, the resonator coupled to an exterior surface of the fluid reservoir to enable the magnetic resonance imaging machine to acquire images of a tissue sample in the cassette.

2. The system of claim 1, further comprising a plurality of vibration dampeners distributed along the length of the stabilization platform.

3. The system of claim 1, wherein the resonator is tunable.

4. The system of claim 1, wherein the resonator is a solenoidal resonator.

5. The system of claim 1, wherein the plurality of coils comprises three parallel wound coils.

6. The system of claim 1, wherein the at least one vibration dampener comprises polyethylene foam.

7. The system of claim 1, wherein a diameter of the at least one vibration dampener is substantially equal to a diameter of the bore of the magnetic resonance imaging machine.

8. The system of claim 1, wherein the cassette is a pathology cassette.

9. The system of claim 1, wherein the fluid reservoir is configured to contain a contrast agent.

10. The system of claim 9, wherein the contrast agent comprises a 1% solution of gadolinium diethylene triamine pentaacetic acid (Gd-DTPA).

11. A method of imaging tissue, the method comprising providing a stabilization system comprising:
    a stabilization platform;
    at least one vibration dampener coupled towards each end of the stabilization platform and configured to stabilize the stabilization platform within a bore of a magnetic resonance imaging machine;
    a fluid reservoir coupled to the stabilization platform and configured to contain a fluid and to receive a cassette, the cassette including one or more openings to receive the fluid from within the fluid reservoir;
    one or more shims coupled with sides of the cassette to restrict movement of the cassette within the fluid reservoir during an imaging session; and
    a plurality of coils forming a resonator, the resonator coupled to an exterior surface of the fluid reservoir to enable the magnetic resonance imaging machine to acquire images of a tissue sample in the cassette;
    adding a contrast agent to the fluid reservoir;
    inserting the cassette holding a resected tissue sample into the fluid reservoir; and
    acquiring one or more magnetic resonance microscopy images of the resected tissue sample.

12. The method of claim 11, wherein the contrast agent comprises a solution of gadolinium diethylene triamine pentaacetic acid (Gd-DTPA).

13. The method of claim 12, wherein the contrast agent comprises between about 1% and about 10% Gd-DTPA.

14. The method of claim 11, wherein the stabilization system further comprising a plurality of vibration dampeners distributed along the length of the stabilization platform.

15. The method of claim 11, wherein the resonator is tunable.

16. The method of claim 11, wherein the resonator is a solenoidal resonator.

17. The method of claim 11, wherein the plurality of coils comprises three parallel wound coils.

18. The method of claim 11, wherein the at least one vibration dampener comprises polyethylene foam.

19. The method of claim 11, wherein a diameter of the at least one vibration dampener is substantially equal to a diameter of the bore of the magnetic resonance imaging machine.

20. The method of claim 11, wherein the cassette is a pathology cassette.

* * * * *